United States Patent [19]

Holdsworth et al.

[11] 4,451,803

[45] May 29, 1984

[54] SPLIT TUNING FILTER

[75] Inventors: Timothy M. Holdsworth, Clay; Joseph P. Hesler, Liverpool; George W. DuBois, Mexico, all of N.Y.

[73] Assignee: Eagle Comtronics, Inc., Clay, N.Y.

[21] Appl. No.: 391,245

[22] Filed: Jun. 23, 1982

[51] Int. Cl.³ .................... H03H 7/01; H03H 1/00
[52] U.S. Cl. .................................. 333/12; 333/167; 333/185
[58] Field of Search ............ 333/12, 185, 24 R, 24 C, 333/167–168, 175–176, 177–184, 169–170; 361/392–400, 420, 424

[56] References Cited

U.S. PATENT DOCUMENTS

| | | | |
|---|---|---|---|
| 1,557,229 | 10/1925 | Zobel | 333/168 |
| 3,365,621 | 1/1968 | Von Fange et al. | 334/85 X |
| 3,522,485 | 8/1970 | De Metrick | 361/399 |
| 3,644,848 | 2/1972 | Kruczek | 361/424 X |
| 4,159,506 | 6/1979 | Latasiewicz et al. | 361/399 |

Primary Examiner—Marvin L. Nussbaum
Attorney, Agent, or Firm—Parkhurst & Oliff

[57] ABSTRACT

A split tuning filter is disclosed in which at least two separate electrically interconnected filter sections mounted on a common circuit board are magnetically isolated through an isolation area defined by a pair of spaced isolation shields. A conductor interconnecting the two filter sections passes through the isolation area and has an external terminal connected thereto which allows each of the two filter sections to be independently tuned, with the isolation area minimizing the tuning impact of one filter section on the other. To further increase magnetic isolation, respective resonating capacitors provided in the filter sections have grounded plates perpendicularly interposed in the line of sight between primary tuning coils which are also respectively provided in the filter sections, with the grounded plates facing toward the isolation shields.

22 Claims, 11 Drawing Figures

SPLIT TUNING FILTER

BACKGROUND AND SUMMARY OF THE INVENTION

The present invention relates to tuned filters and, more particularly, to tuned notch filters which are particularly suitable for use in: (1) removing one or more single or multiple frequency scrambling signals injected into a TV channel to eliminate the possibility of intelligible reception of video and/or audio information; or (2) removing a video carrier in a TV channel to prevent its reception.

A critical requirement of tuned notch filters used in the environments just described is that the filter have a high degree of stability and reliability and further that the filter be economically constructed and quickly and precisely tuned to the proper frequency to ensure complete elimination of the signals to be removed.

Typically, notch filters used in the environments described above must be capable of approximately 80 dB of attenuation at the center frequency of the notch. In order to tune such a filter it is necessary that the tuning equipment be capable of measuring this large degree of attenuation across the filter, requiring sophisticated and expensive equipment. An additional problem with notch filters used in the environments described is that typically more than one filter section is employed in cascade to achieve the high attenuation required, each of which must be independently tuned. However, the tuning of one filter section will affect the electrical performance of the other filter section because of magnetic coupling between the two which increases significantly the time taken to tune the overall filter.

The present invention has been designed to overcome the above problems. Accordingly, one object of the invention is the provisions of a highly reliable and stable notch filter which is also easily tuned. This is achieved with a notch filter having a plurality of filter sections, e.g. two, which are magnetically isolated from one another to enhance the ease of tuning of the separate sections and to minimize the effects of tuning of one filter section on the required tuning of the other. The magnetic isolation is accomplished by providing an isolation area between the plurality of filter sections which is preferably defined by a pair of spaced apart self-locating shields mounted between the filter sections on a circuit board containing the filter sections. The isolation area disrupts magnetic fields which might couple the separate filter sections together thus minimizing the effects of tuning one of the filter sections on the tuning of the other.

An additional object of the invention is the provision of a notch filter employing split tuning wherein each of a plurality of filter sections are magnetically separated from the others by a magnetic isolation area with interconnecting conductors between the different filter sections passing through the magnetic isolation area. An external terminal is provided in the magnetic isolation area and is connected to the conductor passing through the isolation area, which allows external tuning equipment to be interconnected with each of the plurality of filter sections to allow independent tuning of each.

An additional object of the invention is to further improve the magnetic isolation between the plurality of filter sections by locating a resonating capacitor used in each filter section such that a grounded plate of each resonating capacitor disrupts a line of sight between primary inductor coils of the respective filter sections, thus further disrupting any potential magnetic flux path from passing from one filter section to another.

An additional object of the invention is to further improve the performance of the filter sections and promote ease of tuning by positioning electrical components of the respective filter sections such that no components are located in a line of sight between inductor coils of a respective filter section.

These and other further objects, features and advantages of the invention will be more clearly perceived from the ensuing description which is taken in connection with the accompanying drawings.

DETAILED DESCRIPTION OF THE INVENTION

Figure 5:
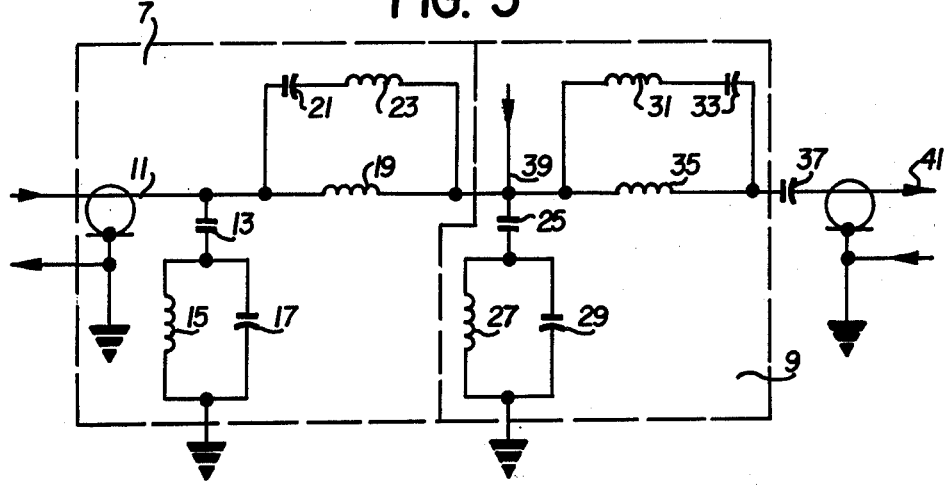
FIG. 5 is an electrical schematic of the notch filter used in connection with the teachings of the invention.

Referring first to FIG. 5, an electrical schematic diagram of a notch filter which can be used in connection with the teachings of the invention is disclosed. An input terminal 11 is designed to receive an incoming television signal including one or more signals which are to be removed (attenuated) by the notch filter. Input terminal 11 is connected to one terminal of a capacitor 13 which in turn is connected at its other terminal to one terminal of a parallel arrangement of inductor 15 and resonating capacitor 17. The opposite terminal of the parallel arrangement of inductor 15 and capacitor 17 is connected to a ground conductor. Terminal 11 is also connected to one terminal of a circuit consisting of an inductor 19, a resonating capacitor 21, and an inductor 23. Capacitor 21 and inductor 23 are connected in series and this series connection is in turn connected in parallel across inductor 19. The circuit thus far described forms one filtering section 7 of the overall notch filter illustrated in FIG. 5. The other terminal of the circuit consisting of inductor 19, capacitor 21 and inductor 23 is connected to a test pin terminal 39, the purpose of which will be described later.

The second filter section 9 illustrated in FIG. 5 includes a capacitor 25 having one terminal connected to test pin terminal 39, the other terminal of capacitor 25 being connected to one terminal of a parallel connection of inductor 27 and resonating capacitor 29. The opposite terminal of this parallel connection being connected to a ground conductor. Terminal 39 is also connected to one terminal of a circuit consisting of inductor 31, resonating capacitor 33 and inductor 35. Inductor 31 and capacitor 33 are series connected and this combination is in turn connected in parallel across inductor 35. The other terminal of the circuit consisting of inductor 31, capacitor 33 and inductor 35 is connected to an output terminal 41. An optional blocking capacitor 37 may be provided between inductor 35 and output terminal 41 and this also is illustrated in FIG. 5.

FIG. 5 thus shows two separate filtering sections 7, 9, the first existing between input terminal 11 and test pin terminal 39 and the second existing between test pin terminal 39 and output terminal 41. Test pin terminal 39 is designed to allow separate access to each of the filtering sections so that each may be separately tuned independent of the other. Thus, the tuning equipment employed to tune the overall filter need not be capable of measuring the depth of the notch produced by the filter by measuring across input terminal 11 and output terminal 41. Instead, the two filter sections can be independently tuned to the notched frequency, which means the measuring equipment need not be as sophisticated as would be required for the entire filter. Typically, each filter section 7 and 9 produces a notch of approximately 40–45 dB and this is what the tuning equipment would be required to measure.

The two filter sections 7 and 9 are magnetically isolated to facilitate independent tuning of the filter sections and thus tuning of the overall notch filter. This is provided by the physical arrangement of the component parts on a circuit board and the provision of isolation shields. The physical arrangement of the component parts shown in FIG. 5, and the isolation shields, are illustrated in FIGS. 1, 2, 3 and 4.

Figure 1:
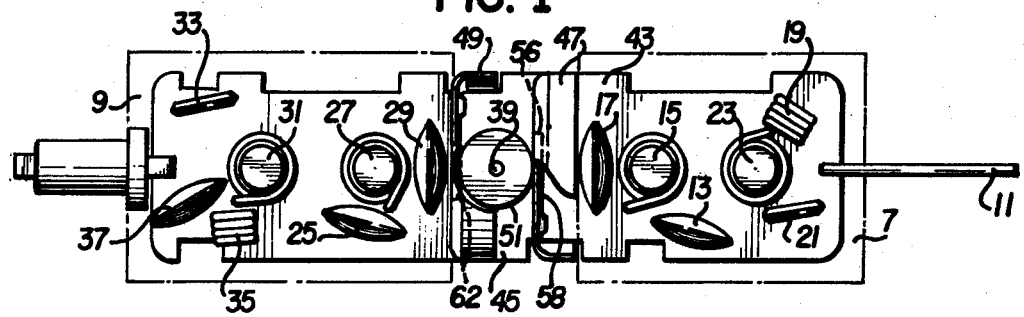
FIG. 1 is a top plan view of a notch filter constructed on a circuit board in accordance with the teachings of the invention.

Referring to FIG. 1, the two filter sections 7 and 9 illustrated in FIG. 5 are shown in FIG. 1 by dotted lines. Physical placement of component parts is important to achieving the purposes of the invention and accordingly a description of that will now follow in connection with FIG. 1.

Figure 3:
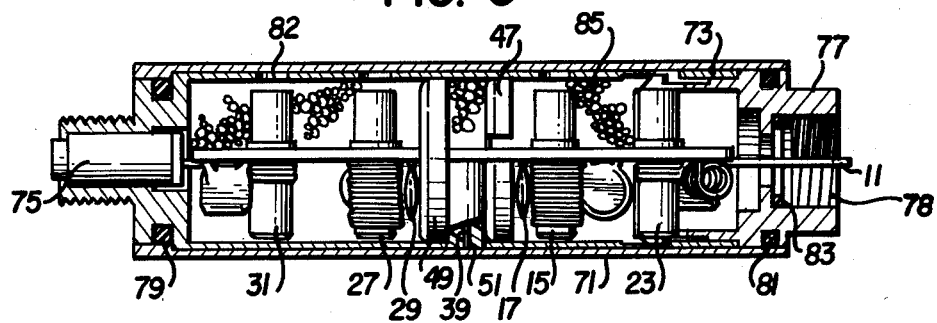
FIG. 3 is a sectional side view through a notch filter and accompanying housing constructed in accordance with the teachings of the invention.
Figure 4:
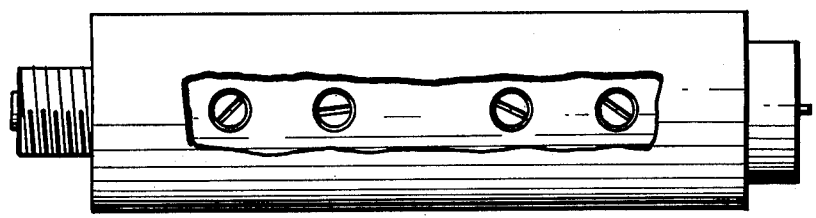
FIG. 4 is a top plan view with center cutaway of the notch filter illustrated in FIG. 3.

The two filter sections 7 and 9 are commonly provided on a single circuit board 43, but are separated thereon by an isolation area 45 which is defined by two isolation shields 47 and 49. These shields project both above and below the upper and lower surfaces of circuit board 43, as illustrated in FIG. 3. Within the isolation area 45 a conductor 38 (FIG. 5) which interconnects the filter sections 7 and 9 runs along part of its course substantially parallel to and midway between the isolation shields 47 and 49. To this portion of the run of conductor 38 test pin terminal 39 is connected to project upwardly from the component mounting surface of board 43 so that it extends from the board and is located between the isolation shields 47 and 49. A sleeve 51 which may be plastic surrounds and protects test pin terminal 39, preventing the latter from contacting ground. Sleeve 51 is also located between isolation shields 47 and 49. The isolation shields 47 and 49 are connected to ground and serve to provide magnetic isolation between the two filter sections 7, 9 by preventing any magnetic fields from one filter section affecting the other filter section and vise versa. Accordingly, the magnetic affects of tuning one filter section will not affect to any substantial degree the other, thus simplifying the overall tuning process for the two sections of the filter.

To further minimize the possibility of magnetic fields from one filter section interfering with another, the respective resonating capacitors 17 and 29 for each of the filter sections 7 and 9 are also located to interrupt a line of sight existing between respective primary inductors 15 and 27 of the filter sections 7 and 9. The capacitors 17 and 29 are of the type which have disc type capacitor plates and they are arranged on the circuit board such that the capacitor plate which is connected to ground (FIG. 5) of each is located away from respective primary inductors 15 and 27 and faces toward an opposing respective isolation shield 47 or 49. The location of these grounded capacitor plates for capacitors 17 and 29 are such that they are approximately perpendicular to and within the line of sight between inductors 15 and 27. This orientation of capacitors 17 and 29 causes them to be substantially in parallel with shields 47 and 49, as shown in FIG. 1. The placement of the grounded capacitor plates away from the respective inductors 15 and 27 has been found to be preferable to placement of the grounded capacitor plates towards respective inductors 15 and 27 as the latter arrangement has an adverse influence on the Q of respective inductors 15 and 27.

To further improve the operating characteristics of the filter and simplify tuning, the inductors 15 and 23 of filter section 7 have a space therebetween which is not occupied by any other electrical component. A similar non-occupied space exists between inductors 27 and 31 of filter section 9. Accordingly, any magnetic coupling between the inductor pairs 15 and 23 and 27 and 31 will not adversely affect any other component to any significant degree.

Figure 2A:
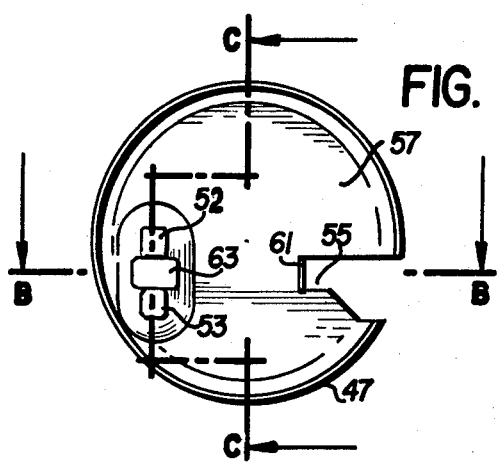
FIGS. 2a, 2b and 2c are side, top and front views of an isolation shield used in connection with the circuit board illustrated in FIG. 1.
Figure 2D:
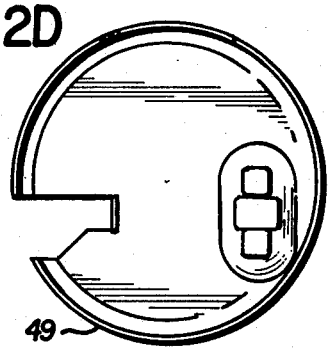
FIGS. 2d and 2e are side and top views of another isolation shield used in connection with the circuit board illustrated in FIG. 1.
Figure 2B:
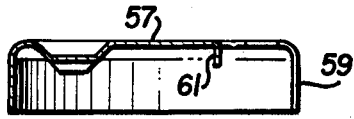
Figure 2E:
Figure 2C:
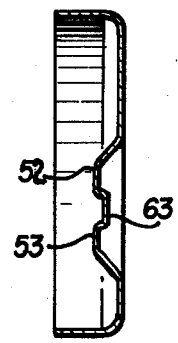

The isolation shields 47 and 49 are illustrated in greater detail in FIGS. 2a, 2b and 2c and in FIGS. 2d and 2e. Isolation shield 47 is formed as a cup-like cylindrically member having a back wall 57 and side wall 59. A slot 55 is cut into one peripheral edge of shield 47, this slot engaging with a portion of circuit board 43 at the end of a slot 56 provided transversely in circuit board 43. A stop element 61 is also formed at the end of slot 55. The height of slot 55 at a point adjacent stop element 61 is slightly larger than the thickness of circuit board 43 so that the end of slot 55 adjacent stop element 61 can engage with the circuit board 43 and holds shield 47 thereto. Isolation shield 47 further includes a guide 63 formed between two protuberances 52 and 53 which is designed to engage with the side 58 of slot 56 provided in the circuit board to thereby self-locate and hold the isolation shield 47 in position. The stop 61 engages with the longitudinal end of the slot 56 provided on circuit board 43 to further limit movement and define and hold the position of the isolation shield 47. To mount the shield 47 to the circuit board the slot 55 is aligned with the slot 56 on the circuit board and the shield is pushed transversely of circuit board 43 causing the side 58 of the board slot 56 to engage shield 47 at guide 63. The shield 47 is further pushed until stop 61 engages with the end of slot 56. The shield 47 is then connected to a ground conductor. Shield 47 may be soldered to the ground conductor to further provide a high degree of electrical and mechanical coupling to the circuit board.

Isolation shield 49 is constructed similarly to that of isolation shield 47 except the slot 55 and guide groove 67 are provided on respective opposite sides of the shield, as shown in FIG. 2d. In addition, as shown in FIG. 2e, a cutout 60 is provided on the top of shield 49 to accommodate the test pin sleeve 51. Shield 49 is mounted to circuit board 43 in the same manner as shield 47 except the respective circuit board slot 62 is cut from an opposite direction with respect to slot 56.

FIG. 3 illustrates the incorporation of the circuit board and component mounting illustrated in FIG. 1 within a suitable filter housing 73. Filter housing 73 is a cylindrical tube with holes 82 being provided to allow access to the tuning slugs (FIG. 4) of the various inductor coils 15, 23, 27 and 31. Filter housing 73 includes integrally on one end thereof a connector 75, while the other end is open. A filter cap 77 is provided for attachment with the open end of filter housing 73. Filter cap 77 includes an internal screw threaded bore 78 for connection with an external cable and input terminal 11 passes through the screw threaded bore portion of filter cap 77. The filter housing 73 and filter cap 77 are interconnected by a press fit with the outer periphery of filter cap 77 fitting within the inner periphery of filter housing 73. Additional solder connections between the two may also be provided to further increase mechanical and electrical stability and reliability. As shown in FIG. 3, the outer diameter of shields 47 and 49 is substantially equal to the inner diameter of filter housing 73.

Filter housing 73 and filter cap 77 are in turn slid within and surrounded by a tube sleeve housing 71. A pair of O-rings 79 and 81 are provided respectively between inner periphery of tube sleeve housing 71 and the outer periphery of filter housing 73 at one end and filter cap 77 at the other end to prevent water, moisture, etc. from entering into the interior of tube sleeve housing 71. An additional O-ring 83 is provided within the screw thread bore 78 of filter cap 77 for engaging with a cable coupling to also prevent the entrance of water, moisture, etc. into the interior of tube sleeve 71 and filter housing 73.

Prior to final notch filter assembly, the entire space within filter housing 73 and filter cap 77 may be filled with polystyrene beads 85 which, after final assembly, are heated to form an expanded cohesive polystyrene mass which serves to rigidify component mounting and protect the filter from damage caused by shocks, vibration, etc.

As illustrated in FIG. 3, test pin terminal 39 and associated sleeve 51 are accessible to the exterior of housing 73 through a hole, but when filter housing 73 is slid into tube sleeve housing 71, this hole as well as the alignment holes 82 are covered. Accordingly, and as evident, alignment of the filter occurs before the final assembly of filter housing 73 and filter cap 77 into the tube sleeve housing 71.

By providing test pin 39 at the interconnection of the two filter sections 7 and 9 one is capable, during filter alignment, of independently tuning each of the filter sections. That is, measuring equipment could be connected across filter section 7 by means of terminals 11 and 39 and across filter section 9 by means of terminals 39 and 41. Moreover, the provisions of the isolation shields 47 and 49, the location of the grounded plates of capacitors 17 and 29, and the non-mounting of electrical components in the space between coils 15 and 23 and 27 and 31 facilitates overall alignment of the filter. Each of the filter sections 7 and 9 can be independently tuned and the magnetic affects of tuning one filter on another are minimized or eliminated. Accordingly, each filter section can be tuned with a much less sophisicated apparatus and repetitive back and forth tuning of the two filter sections can be minimized or avoided as each section can be independently tuned to a preferred center frequency, so that the effects of the two cascaded filter sections 7 and 9 provides an additive attenuation characteristic.

Figure 6A:
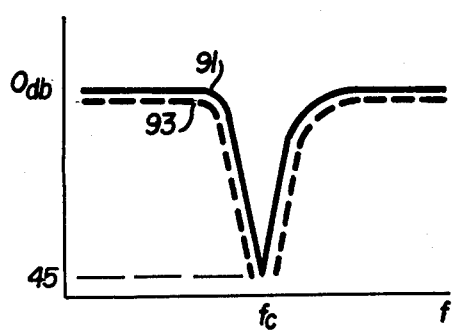
FIGS. 6a and 6b are graphs respectively showing the individual and combined attenuation characteristics of the filter sections of a notch filter constructed in accordance with the teachings of the invention.
Figure 6B:
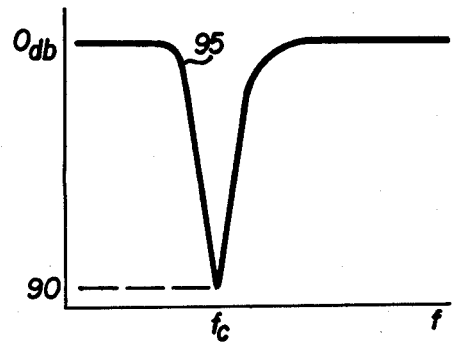

FIG. 6a illustrates the separate attenuation characteristics for each of the filter sections 7 and 9 when independently adjusted to a center frequency $f_c$. As shown, each filter has an approximate attenuation characteristic of 40-45 dB. As illustrated in FIG. 6b, these attenuation characteristics are additive to produce an overall attenuation characteristic for the notch filter, between input terminal 11 and output terminal 41, of approximately of 80-90 dB.

Although one embodiment of the invention has been described above with reference to specific structures, it should be appreciated that various modifications can be made to the invention without departing from its spirit or scope. For example, although the invention has been described with reference to a notch filter having two filter sections, it should be apparent that the same teachings are applicable to isolate adjacent filter sections in a tuned filter having more than two such sections. Also, the teachings are applicable to tuned filters in general and not solely to notch filters. Accordingly, the invention is not limited by the foregoing description, but is only limited by the scope of the appended claims.

What is claimed is:

1. An electrical signal filter comprising:
   a single component circuit board for mounting and electrically interconnecting electrical filter components on at least one of an upper and lower surface thereof;
   a first filter section formed by electrical filter components and provided on a first area of said single circuit board;
   a second filter section formed by electrical filter components and provided on a second area of said circuit board, said first and second filter sections being electrically interconnected by a conductor and said first and second filter sections being spaced from one another to form an isolation area through which said conductor passes;
   a metallic container which receives said single circuit board to form a housing about said circuit board; and
   a pair of metallic members attached to said circuit board and spaced by a predetermined amount at positions on opposite sides of said isolation area, each of said metallic structures being constructed and arranged to form a guide for positioning and mounting said single circuit board within said metallic container such as to form a first cavity enclosing said first filter section, a second cavity enclosing said second filter section, and a third cavity defining said isolation area which separates said first and second cavity.

2. A filter as in claim 1 wherein each of said metallic members are constructed and arranged to form electrical shields between said first and second filter sections which electrically isolate said filter sections from one another.

3. A filter as in claim 2 wherein each said shield extends above and below said circuit board.

4. A filter as in claim 3 wherein each said shield contains a mounting slot and said circuit board contains a pair of mounting slots which are complementary to the mounting slots of said shields, said shields being mounted to said circuit board by engagement of the mounting slots of said shields with portions of the circuit board adjacent the mounting slots of said circuit board.

5. A filter as in claim 4 further comprising means for holding said shields to said circuit board.

6. A filter as in claim 5 wherein said holding means comprises a pair of protuberances in a wall of each said shield which define a guide between them which engages with a side of a mounting slot provided in said circuit board.

7. A filter as in claim 2 further comprising an electrical connection terminal connected with said conductor.

8. A filter as in claim 7 wherein said electrical connection terminal is located between said isolation shields.

9. A filter as in claim 2 further comprising means for electrically connecting said shields with a ground conductor.

10. A filter as in claim 1 wherein said first filter section comprises an input terminal and an output terminal and a ground terminal, a first capacitor and first inductor connected in series and across a second inductor, said second inductor having one terminal connected to said input terminal and another terminal connected to said output terminal, a second capacitor connected in parallel with a third inductor, one end of the parallel connection of said second capacitor and third inductor being connected to said ground terminal, and a third capacitor connected between said input terminal and the other end of the parallel connection of said second capacitor and third inductor.

11. A filter as in claim 1 wherein said metallic members are coupled to mechanically and electrically interconnect with said metallic container.

12. A filter as in claim 1 wherein said metallic members are formed to preclude a line of sight path to inhibit radiation of electrical energy between said first and second cavities.

13. A filter as in claim 1 wherein said first and second filters are constructed and arranged to cooperate with said first and second cavities and said isolation area between said filter sections to produce an attenuation of signal energy by at least 70 dB.

14. An electrical signal filter comprising:
a component circuit board for mounting and electrically interconnecting electrical filter components on at least one of an upper and lower surface thereof;
a first filter section formed by electrical filter components and provided on a first area of said circuit board;
a second filter section formed by electrical filter components and provided on a second area of said circuit board, said first and second filter sections being electrically connected by a conductor passing through an isolation area of said circuit board located between said first and second areas, said second filter section comprising an input terminal and an output terminal and a ground terminal, a first capacitor and first inductor connected in series and across a second inductor, said second inductor having one terminal connected to said input terminal and another terminal connected to said output terminal through a second capacitor, a third capacitor connected in parallel with a third inductor, one end of the parallel connection of said third capacitor and third inductor being connected to said ground terminal, a fourth capacitor connected between said input terminal and the other end of the parallel connection of said third capacitor and third inductor; and
a pair of signal isolation shields spaced apart a predetermined amount and defining opposite sides of said isolation area, each of said shields extending perpendicularly at least above a component mounting surface of said circuit board.

15. A filter as in claims 10 or 14 wherein said first and third inductors are separated on said circuit board by a space having no electrical components mounted therein.

16. An electrical signal filter comprising:
a component circuit board for mounting an electrically interconnecting electrical filter components on at least one of an upper and lower surface thereof;
a first filter section formed by electrical filter components and provided on a first area of said circuit board;
a second filter section formed by electrical filter components and provided on a second area of said circuit board, said first and second filter sections being electrically connected by a conductor passing through an isolation area of said circuit board located between said first and second areas; and
a pair of signal isolation shields spaced apart a predetermined amount and defining opposite sides of said isolation area, each of said shields extending perpendicularly at least above a component mounting surface of said circuit board, each of said filter sections including at least one capacitor containing a grounded plate which is mounted such that the grounded plate is substantially in parallel with and adjacent to a respective one of said shields.

17. An electrical signal filter comprising:
a component circuit board for mounting and electrically interconnecting electrical filter components on at least one of an upper and lower surface thereof;
a first filter section formed by electrical filter components and provided on a first area of said circuit board;
a second filter section formed by electrical filter components and provided on a second area of said circuit board, said first and second filter sections being electrically connected by a conductor passing through an isolation area of said circuit board located between said first and second areas and each of said first and second filter sections including at least a respective primary inductor and a respective resonating capacitor, the respective resonating capacitors of said sections being placed between said primary inductors and being located on opposite sides of said isolation area, each said resonating capacitors including a plate area connected to a respective ground terminal for said first and second filter sections, said plate areas of said resonating capacitors being substantially perpendicular to a line of sight between said primary inductors; and
a pair of signal isolation shields spaced apart a predetermined amount and defining opposite sides of said isolation area, each said shield extending perpendicularly at least above a component mounting surface of said circuit board.

18. A filter as in claim 17 wherein said plate areas which are connected to respective ground conductors face and are opposite to a respective isolation shield.

19. A filter as in claim 17 wherein each said shield includes means for engaging with and self locking to said circuit board.

20. An electrical filter comprising:
a single circuit board;
a first electrical filter section disposed on a first area of said circuit board and having an input terminal and an output terminal;
a second electrical filter section disposed on a second area of said circuit board and having an input terminal and an output terminal, said first and second filter sections being separated by a predetermined amount to form an isolation area therebetween, the output terminal of said first filter section being coupled to the input terminal of said second filter section by an electrical conductor which passes through said isolation area on said circuit board;
a metallic housing receiving said circuit board and coupled to enclose said circuit board and said first and second filter sections within said housing;
a first end portion coupled to one end of said housing to provide an electrical input to the input terminal said first filter section and to seal said one end of said housing;
a second end portion coupled to a second end of said housing to form an electrical output from the output terminal of said second filter section and to seal said second end of said housing;
a first metallic member coupled to said circuit board and having an outer circumference which conforms to an inner surface of said housing to mount said circuit board within said housing;
a second metallic member coupled to said circuit board and spaced from said first metallic member and having an outer circumference which conforms to said intercylindrical surface of said housing for mounting said circuit board within said housing, said first and second metallic members being positioned to define a first cavity in which said first filter section is disposed, a second cavity in which said second filter section is disposed, and a third cavity which defines said isolation area.

21. The filter of claim 20 wherein said first and second filter sections are each constructed as a notch filter tunable to the same frequency, said housing is cylindrical, and said first and second metallic members are circular.

22. The filter of claim 20 further comprising an electrical terminal coupled to extend within said second cavity and electrically coupled to the conductor within said third cavity, said terminal being constructed and arranged to provide independent tuning of said first and second filter sections.

* * * * *